(12) United States Patent
Anzou et al.

(10) Patent No.: US 8,134,880 B2
(45) Date of Patent: Mar. 13, 2012

(54) SEMICONDUCTOR INTEGRATED CIRCUIT

(75) Inventors: Kenichi Anzou, Kawasaki (JP);
Chikako Tokunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 12/726,531

(22) Filed: Mar. 18, 2010

(65) Prior Publication Data
US 2011/0058434 A1 Mar. 10, 2011

(30) Foreign Application Priority Data
Sep. 8, 2009 (JP) .................................. 2009-207369

(51) Int. Cl.
*G11C 29/00* (2006.01)
(52) U.S. Cl. ........................................ 365/200; 365/201
(58) Field of Classification Search .................. 365/200, 365/201
See application file for complete search history.

(56) References Cited

U.S. PATENT DOCUMENTS

| | | | | |
|---|---|---|---|---|
| 6,388,929 B1 * | 5/2002 | Shimano et al. | ............ | 365/201 |
| 6,504,769 B2 * | 1/2003 | Do et al. | .............. | 365/200 |
| 7,317,645 B2 * | 1/2008 | Kim et al. | .............. | 365/200 |
| 2001/0030896 A1 * | 10/2001 | Ooishi | .............. | 365/200 |
| 2008/0022176 A1 | 1/2008 | Anzou et al. | | |
| 2009/0024885 A1 | 1/2009 | Anzou et al. | | |
| 2009/0172483 A1 | 7/2009 | Anzou et al. | | |
| 2010/0125766 A1 | 5/2010 | Anzou et al. | | |
| 2010/0251043 A1 | 9/2010 | Anzou et al. | | |

FOREIGN PATENT DOCUMENTS

| | | |
|---|---|---|
| JP | 2004047017 | 2/2004 |
| JP | 2008146754 | 6/2008 |

* cited by examiner

*Primary Examiner* — Anh Phung
(74) *Attorney, Agent, or Firm* — Turocy & Watson, LLP

(57) ABSTRACT

A semiconductor integrated circuit has a plurality of memory devices each comprising a memory cell array which includes a plurality of memory cells to store data, a spare part which includes a redundant cell to avoid a memory cell judged to be defective in the plurality of memory cells and conduct redundancy repair on data, and a switching circuit to avoid the defective memory cell and conduct switching to the redundant cell; and a repair code decoding circuit comprising a storage circuit which stores a repair code, a decoder which outputs a repair decoded signal obtained by decoding the repair code, wherein the switching circuit respectively in the memory devices avoids a memory cell corresponding to the repair decoded signal and conducts switching to the redundant cell of the memory devices in accordance with the repair decoded signal.

20 Claims, 11 Drawing Sheets

SEMICONDUCTOR INTEGRATED CIRCUIT

CROSS-REFERENCE TO RELATED APPLICATION

This application is based upon and claims the benefit of priority from the prior Japanese Patent Application No. 2009-207369, filed on Sep. 8, 2009, the entire contents of which are incorporated herein by reference.

BACKGROUND OF THE INVENTION

1. Field of the Invention

The present invention relates to a semiconductor integrated circuit which repairs a memory device from faults.

2. Background Art

In general, the redundancy repairing technique has been used up to now to repair a memory device judged to be defective in memory devices embedded in a semiconductor integrated circuit, by using a redundant memory cell (see, for example, JP-A 2004-47017 (KOKAI) and JP-A 2008-146754 (KOKAI)). Owing to the redundancy repair technique, it is possible to ship the chip as an acceptable article.

For example, a redundant structure in a semiconductor integrated circuit has a spare part including a spare bit cell in association with a row and a column in a memory cell array.

The simplest redundant structure has one set of spare parts for a unit to be repaired. As for more complicated redundant structures, there are a structure having a spare part associated with a row and a column, a structure including a plurality of spares, and a structure in which one memory cell array is divided into a plurality of segments and each segment has a spare part.

In the repair of a memory device, a decision is made whether there is a defect in a memory cell and repair is possible on the basis of the manufacture test and system diagnosis. If repair is possible, a repair circuit is configured to avoid selection of the pertinent defective cell and the repair circuit is adapted to operate by using only normal memory cells. As a result, redundancy repair of the memory device is conducted.

For example, when conducting a manufacture test, data for bringing the memory device into the repaired state (hereafter referred to as repair code) are stored onto a semiconductor integrated circuit or an externally stored repair code is input. As a result, the memory device is repaired.

The defect state of the memory device is different every manufactured die (chip). Therefore, the repair code is stored by using a fuse device or the like according to the defect state.

Usually, the repair code required to repair a defect in a memory device is encoded to minimize a data retaining area and stored. And the stored repair code is decoded and is given to a repair circuit for repairing defects. As a result, the repair circuit changes over a signal path, and the memory device is repaired. In this case, a semiconductor integrated circuit needs to have a decoding circuit for decoding the repair code as the repair circuit.

The defect state of the memory device is different not only every die (chip) as already described, but also every memory device on the semiconductor integrated circuit. In the conventional art, therefore, the semiconductor integrated circuit includes a register which retains a repair code and a decoder which decodes the repair code every memory instance.

In this case, the sum total of the circuit areas for repairing all memory devices of the repair object increases, and the circuit area of the semiconductor integrated circuit itself increases.

SUMMARY OF THE INVENTION

According to one aspect of the present invention, there is provided: a semiconductor integrated circuit repairing a plurality of memory devices by using one repair code, the semiconductor integrated circuit comprising:

a plurality of memory devices each comprising a memory cell array which includes a plurality of memory cells to store data, a spare part which includes a redundant cell to avoid a memory cell judged to be defective in the plurality of memory cells and conduct redundancy repair on data, and a switching circuit to avoid the defective memory cell and conduct switching to the redundant cell; and a repair code decoding circuit comprising a storage circuit which stores a repair code, a decoder which outputs a repair decoded signal obtained by decoding the repair code, wherein the switching circuit respectively in the memory devices avoids a memory cell corresponding to the repair decoded signal and conducts switching to the redundant cell of the memory devices in accordance with the repair decoded signal.

According to another aspect of the present invention, there is provided: a semiconductor integrated circuit comprising:

a plurality of memory devices each comprising a memory cell array which includes a plurality of memory cells to store data, a spare part which includes a redundant cell to avoid a memory cell judged to be defective in the plurality of memory cells and conduct redundancy repair on data, and a switching circuit to avoid the defective memory cell and conduct switching to the redundant cell; and a repair code decoding circuit comprising a storage circuit which stores a first repair code and a second repair code different from the first repair code, a first decoder which outputs a first repair decoded signal obtained by decoding the first repair code, a second decoder which outputs a second repair decoded signal obtained by decoding the second repair code, wherein the switching circuit respectively in first memory devices avoids a memory cell corresponding to the first repair decoded signal and conducts switching to the redundant cell of the first memory devices in accordance with the first repair decoded signal, the first memory devices classified into a first group in the plurality of memory devices, and the switching circuit respectively in second memory devices avoids a memory cell corresponding to the second repair decoded signal and conducts switching to the redundant cell of the second memory devices in accordance with the second repair decoded signal, the second memory devices classified into a second group other than the first group in the plurality of memory devices.

According to still another aspect of the present invention, there is provided: a semiconductor integrated circuit comprising:

a plurality of memory devices each comprising a memory cell array which includes a plurality of memory cells to store data, a spare part which includes a redundant cell to avoid a memory cell judged to be defective in the plurality of memory cells and conduct redundancy repair on data, and a switching circuit to avoid the defective memory cell and conduct switching to the redundant cell; and a repair code decoding circuit comprising a storage circuit which stores a first repair code, a second repair code different from the first repair code, and a repair object memory selection code, a first decoder which outputs a first repair decoded signal obtained by decoding the first repair code, a second decoder which outputs a second repair decoded signal obtained by decoding the second repair code, a third decoder which decodes the repair object memory selection code and outputs a repair object memory selection signal, and a repair object memory selection circuit which is supplied with the first repair decoded signal, the second repair decoded signal, and the repair object memory selection signal to output the first repair code to first memory devices classified into a first group in the plurality of memory devices based on the repair object memory selection signal and to output the second repair code to second memory devices classified into a second group other than the first group in the plurality of memory devices based on the repair object memory selection signal, wherein the switching circuit respectively in the first memory devices avoids a memory cell corresponding to the first repair decoded signal and conducts switching to the redundant cell of the first memory devices in accordance with the first repair decoded signal, and the switching circuit respectively in the second memory devices avoids a memory cell corresponding to the second repair decoded signal and conducts switching to the redundant cell of the second memory devices in accordance with the second repair decoded signal.

DETAILED DESCRIPTION

Comparative Example

First, a semiconductor integrated circuit including a memory device in a comparative example to be compared with the present invention will now be described.

Figure 1:
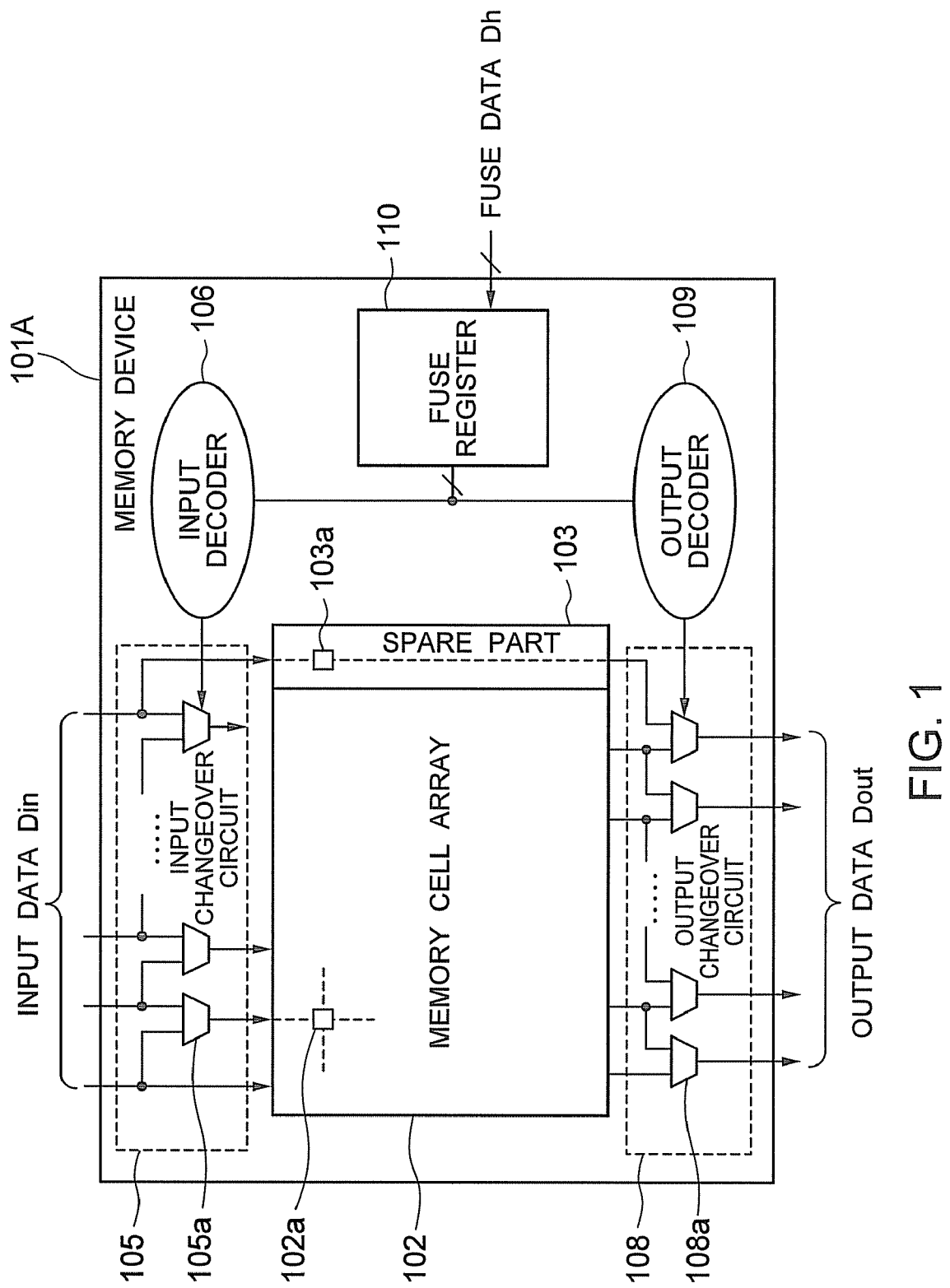
FIG. 1 is a block diagram showing a principal part configuration of a memory device 101A in the comparative example.

FIG. 1 is a block diagram showing a principal part configuration of a memory device 101A in the comparative example.

As shown in FIG. 1, the memory device 101A includes a memory cell array 102, a spare part 103, an input switching circuit 105, an input decoder 106, an output switching circuit 108, an output decoder 109, and a fuse register 110.

The memory cell array 102 is formed by arranging a plurality of memory cells 102a, which store data, in a matrix form.

The spare part 103 includes redundant cells 103a to conduct redundancy repair on data by avoiding a memory cell (defective cell) 102a judged to be defective in the plurality of memory cells 102a.

The fuse register 110 is adapted to retain fuse data (repair code) Dh in synchronism with a clock signal, and output the retained fuse data Dh to the input decoder 106 and the output decoder 109. The fuse data Dh is stored In a fuse device (not illustrated) which is provided externally to the memory device 101A.

The input decoder 106 is adapted to decode the input fuse data and output a decoded signal. The output decoder 109 is adapted to decode the input fuse data and output a decoded signal.

The input switching circuit 105 includes a plurality of multiplexers 105a to which input data Din is input. The input switching circuit 105 is adapted to shift signal paths via which the input data Din is input to input-output bits of the memory cells 102a and the redundant cell 103a, in accordance with the decoded signal which is input from the input decoder 106.

For example, when conducting redundancy repair, the input switching circuit 105 writes the input data with input-output bits beyond an input-output bit in which there is a memory cell judged to be defective being shifted by one bit in accordance with the decoded signal. In other words, when conducting redundancy repair, the input switching circuit 105 avoids the memory cell judged to be defective by shifting the input data Din to be stored in input-output bit positions between the memory cell judged to be defective and the redundant cell.

The output switching circuit 108 includes multiplexers 108a to which data read out from the memory cells 102a and the redundant cell 103a are input. The output switching circuit 108 is adapted to switching signal paths ranging from the memory cells 102a in the memory cell array 102 and the redundant cell 103a in accordance with the decoded signal which is input thereto from the output decoder 109, and output output data Dout.

In other words, the output switching circuit 108 conducts switching on the output data from the memory cells 102a on the basis of the given decoded signal, and prevents data in an input-output bit having a defective cell from being output as the output data Dout.

In this way, the input switching circuit 105 and the output switching circuit 108 are adapted to remove the memory cell judged to be defective (defective cell) 102a from objects of data storage and readout in accordance with the decoded signal, and shift the object of storage and readout of data to be stored into the defective cell in bit positions ending with the redundant cell 103a.

In this way, the memory device 101A repairs a defect within an input-output range of 1 bit and operates in accordance with the fuse data Dh, which is the repair code.

Figure 2:
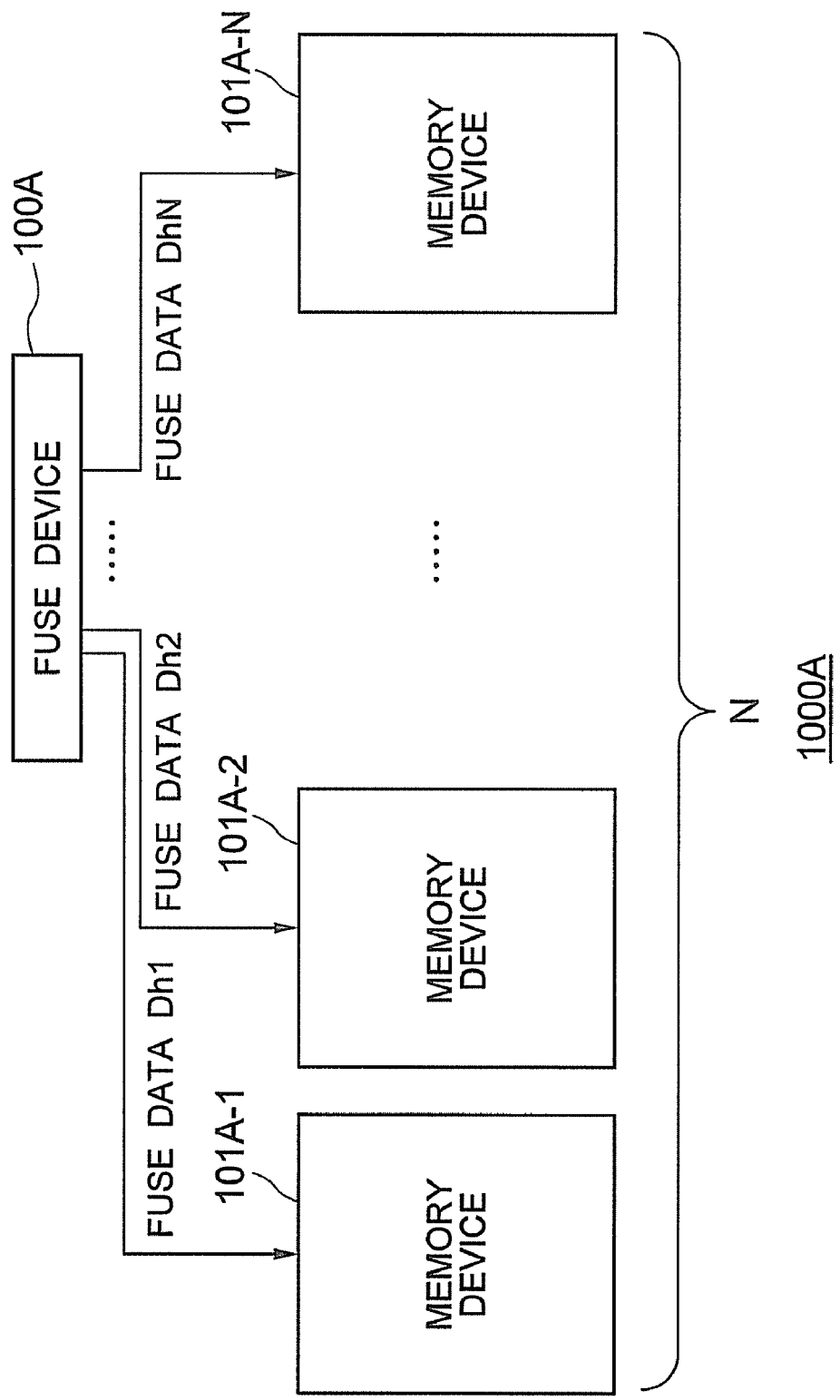
FIG. 2 is a block diagram showing an example of a configuration of a semiconductor integrated circuit 1000A including a plurality of memory devices each shown in FIG. 1 in the comparative example.

FIG. 2 is a block diagram showing an example of a configuration of a semiconductor integrated circuit 1000A including a plurality of memory devices each shown in FIG. 1 in the comparative example.

As shown in FIG. 2, the semiconductor integrated circuit 1000A includes a plurality of (N) memory devices 101A-1, 101A-2, ..., 101A-N, and a fuse device 100A which stores a plurality of (N) fuse data Dh1, Dh2, ..., DhN.

Each of the memory devices 101A-1, 101A-2, ..., 101A-N is a circuit having the same configuration as that of the memory device 101A shown in FIG. 1.

The memory devices 101A-1, 101A-2, ..., 101A-N differ in defect state. Therefore, the semiconductor integrated circuit 1000A in the comparative example stores fuse data Dh1, Dh2, ..., DhN, which are repair codes, separately in the fuse device 100A, and conducts redundancy repair processing through respective decoders.

In this way, the semiconductor integrated circuit 1000A in the comparative example includes a register which retains a repair code and a decoder which decodes the repair code every memory instance.

In the comparative example, therefore, the sum total of circuit areas of repair circuits for all memory devices increases. This results in a problem that the circuit area of the semiconductor integrated circuit itself increases.

The present invention has been made in view of these circumstances.

Hereafter, a semiconductor integrated circuit according to the present invention will be described more specifically with reference to the drawings.

First Embodiment

Figure 3:
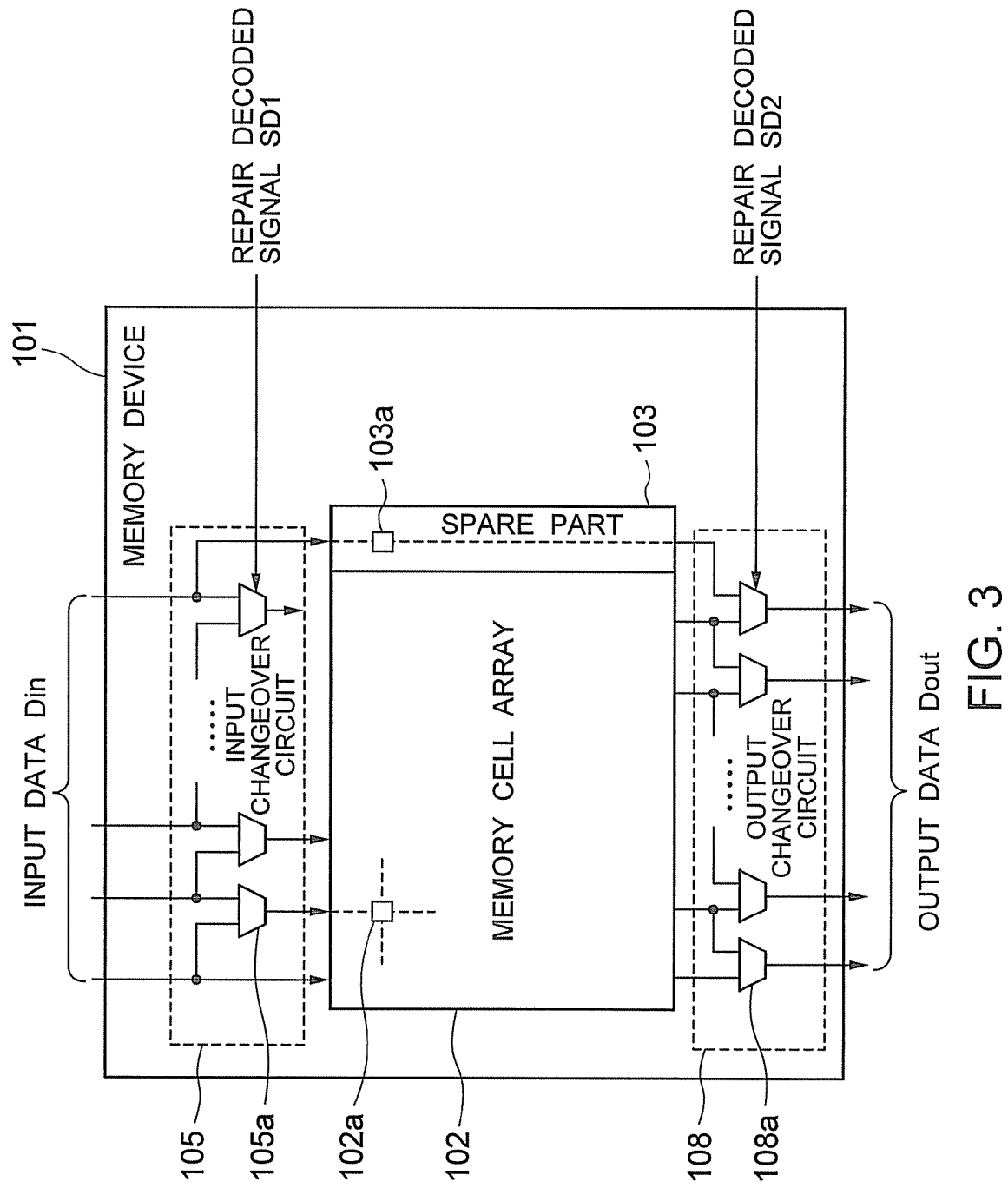
FIG. 3 is a block diagram showing an example of a principal part configuration of a memory device 101 according to a first embodiment which is a mode of the present invention.

FIG. 3 is a block diagram showing an example of a principal part configuration of a memory device 101 according to a first embodiment which is a mode of the present invention.

As shown in FIG. 3, the memory device 101 includes a memory cell array 102, a spare part 103, an input switching circuit 105, and an output switching circuit 108.

The memory device 101 is, for example, an SRAM (Static Random Access Memory) or a DRAM (Dynamic Random Access Memory). As compared with the memory device 101A in the comparative example, the input decoder 106, the output decoder 109, and the fuse register 110 are removed in the memory device 101 according to the first embodiment.

The memory cell array 102 is formed by arranging a plurality of memory cells 102a, which store data, in a matrix form.

The spare part 103 includes redundant cells 103a to conduct redundancy repair on data by avoiding a memory cell (defective cell) 102a judged to be defective in the plurality of memory cells 102a.

The input switching circuit 105 includes a plurality of multiplexers 105a to which input data Din is input. The input switching circuit 105 is adapted to shift signal paths via which the input data Din is input to bit positions between the memory cells 102a and the redundant cell 103a, in accordance with a repair decoded signal SD1.

For example, when conducting redundancy repair, the input switching circuit 105 writes the input data with input-output bits beyond an input-output bit in which there is a memory cell judged to be defective being shifted by one bit in accordance with the repair decoded signal SD1.

In other words, when conducting redundancy repair, the input switching circuit 105 avoids the memory cell judged to be defective by shifting the input data Din to be stored in input-output bit positions between the memory cell judged to be defective and the redundant cell.

The output switching circuit 108 includes multiplexers 108a to which data read out from the memory cells 102a and the redundant cell 103a are input. The output switching circuit 108 is adapted to shift signal paths between the memory cells 102a in the memory cell array 102 and the redundant cell 103a in accordance with a repair decoded signal SD2, and output output data Dout.

In other words, the output switching circuit 108 conducts switching on the output data from the memory cells 102a on the basis of the given repair decoded signal SD2 and prevents an output of an input-output bit having a defective cell from being output as the output data Dout.

The repair decoded signals SD1 and SD2 are signals obtained by decoding repair codes for redundancy repair as described later.

In this way, the input switching circuit 105 and the output switching circuit 108 are adapted to remove the memory cell judged to be defective (defective cell) 102a from objects of data storage and readout in accordance with the repair decoded signals SD1 and SD2, and shift the object of storage and readout of data to be stored into the defective cell in bit positions ending with the redundant cell 103a.

As heretofore described, the memory device 101 is adapted to repair a one-bit defect in accordance with the repair decoded signals SD1 and SD2 and operate.

The configurations of the input switching circuit 105 and the output switching circuit 108 are nothing but examples. The present embodiment can be applied to other configurations as long as redundancy repair is conducted in accordance with the repair decoded signal.

In the ensuing description, the input switching circuit 105 and the output switching circuit 108 are referred to collectively as switching circuit having intensive functions. In this case, the repair decoded signals SD1 and SD2 are referred to collectively as repair decoded signal.

Figure 4:
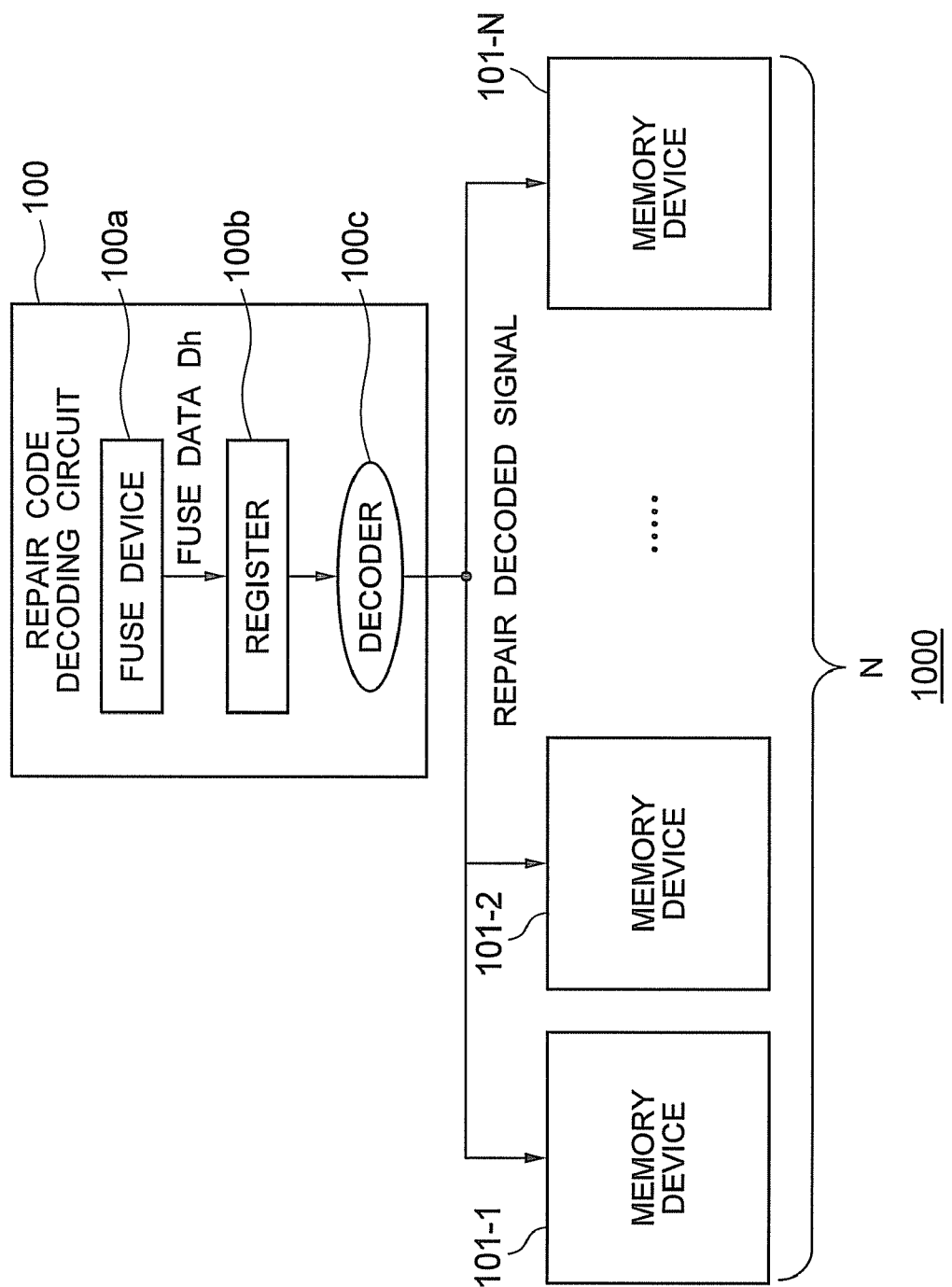
FIG. 4 is a block diagram showing an example of a configuration of a semiconductor integrated circuit 1000 including a plurality of memory devices according to the first embodiment.

FIG. 4 is a block diagram showing an example of a configuration of a semiconductor integrated circuit 1000 including a plurality of memory devices according to the first embodiment.

As shown in FIG. 4, the semiconductor integrated circuit 1000 includes a plurality of (N) memory devices 101-1, 101-2, ..., 101-N, and a repair code decoding circuit 100.

Each of the memory devices 101-1, 101-2, ..., 101-N is a circuit having the same configuration as that of the memory device 101 shown in FIG. 3.

The repair code decoding circuit 100 includes a storage circuit (fuse device) 100a, a register (fuse register) 100b, and a decoder 100c.

The storage circuit 100a is adapted to store one repair code (fuse data Dh) for avoiding a memory cell judged to be defective on the basis of results obtained by testing the memory devices 101-1, 101-2, ..., 101-N and using the redundant cell. The storage circuit 100a has, for example, a fuse element to store the fuse data Dh.

The repair code is generated by, for example, an external test circuit (not illustrated) and stored in the storage circuit. For example, the test circuit compares a result obtained by testing a memory device according to a test pattern with an expected value, and makes a decision whether the memory device can be repaired, on the basis of a result of the comparison. If the test circuit judges that the memory device can be repaired, the test circuit generates the repair code for conducting redundancy repair on the memory device.

The register 100b is adapted to retain the repair code (fuse data) stored in the storage circuit 100a, in synchronism with a clock signal.

The decoder 100c is adapted to output a repair decoded signal obtained by decoding the repair code retained in the register 100b.

The switching circuits respectively in the memory devices 101-1, 101-2, ..., 101-N are adapted to remove a memory cell 102a corresponding to the repair decoded signal from objects of data storage and readout in accordance with the repair decoded signal.

In other words, the same repair decoded signal is input to all of the N memory devices 101-1, 101-2, ..., 101-N and the switching circuits are brought into the same state.

Memory devices free of defects are acceptable articles even if they are brought into the repair state. In a plurality of memory devices having defects, there is a case that there are only defects which bring about acceptable articles in repair states which are the same each other. In this case, a plurality of memory devices having the defects are brought into the acceptable article state even in a repair state corresponding to one repair code.

If there are defects in different input-output ranges in at least two memory devices, it is impossible to repair the whole semiconductor integrated circuit by using one repair code.

Typically in the actual manufacturing process, however, the number of memory devices which need repair is very smaller than the total number of memory devices.

In the semiconductor integrated circuit according to the present first embodiment, therefore, the memory devices share a repair circuit (the register 100b and the decoder 100c) as already described. As a result, the circuit area required for the repair circuit can be reduced as compared with the comparative example. Furthermore, since the number of repair codes is one, the required fuse device area can be minimized.

In the semiconductor integrated circuit according to the present embodiment, the increase of the circuit area can be suppressed as heretofore described.

Second Embodiment

In the first embodiment, the case where the number of repair codes stored in the fuse device is one has been described.

In a second embodiment, a configuration of a semiconductor integrated circuit in which a plurality of repair codes are set in a necessary range to improve the possibility of repair in the case where there are different defects in memory cells of a plurality of memory devices will be described.

Hereafter, the case where two different repair codes are set will be described as an example. However, the same is true of the case where at least three different repair codes are set.

Figure 5:
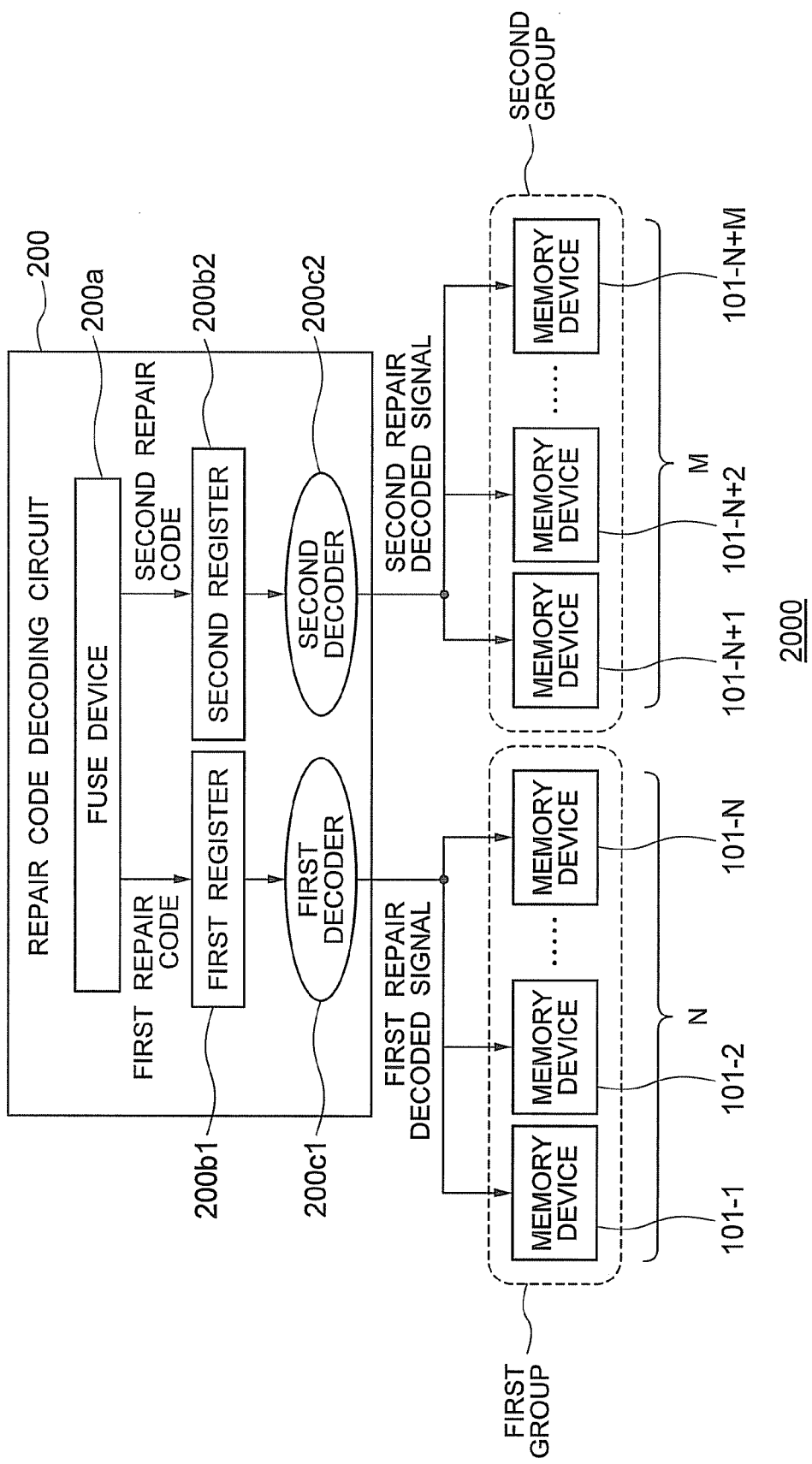
FIG. 5 is a block diagram showing an example of a configuration of a semiconductor integrated circuit 2000 including a plurality of memory devices.

FIG. 5 is a block diagram showing an example of a configuration of a semiconductor integrated circuit 2000 including a plurality of memory devices. In FIG. 5, the same characters as those in FIG. 4 denote like components in the first embodiment.

As shown in FIG. 5, the semiconductor integrated circuit 2000 includes a plurality of (N+M) memory devices 101-1, 101-2, ..., 101-N, 101-N+1 101-N+2, ... 101-N+M, and a repair code decoding circuit 200.

Each of the memory devices 101-1, 101-2, ..., 101-N+M is a circuit having the same configuration as that of the memory device 101 shown in FIG. 3.

The repair code decoding circuit 200 includes a storage circuit (fuse device) 200a, a first register (first fuse register) 200b1, a second register (second fuse register) 200b2, a first decoder 200c1, and a second decoder 200c2.

The storage circuit 200a is adapted to store a first repair code (fuse data) to avoid a memory cell judged to be defective on the basis of results obtained by testing the memory devices 101-1, 101-2, ..., 101-N classified into a first group in a plurality of memory devices and use a redundant cell, and a second repair code (fuse data) to avoid a memory cell judged to be defective on the basis of results obtained by testing the memory devices 101-N+1, 101-N+2, ..., 101-N+M classified into a second group other than the first group in a plurality of memory devices and use a redundant cell.

The first repair code and the second repair code are set to be different from each other. The storage circuit 200a has, for example, a fuse element to store the fuse data.

The first and second repair codes are generated by, for example, an external test circuit (not illustrated) and stored in the storage circuit. For example, the test circuit compares a result obtained by testing a memory device according to a test pattern with an expected value, and makes a decision whether the memory device can be repaired, on the basis of a result of the comparison. If the test circuit judges that the memory device can be repaired, the test circuit generates the first or second repair code for conducting redundancy repair on the memory device.

The first register 200b1 is adapted to retain the first repair code (fuse data) stored in the storage circuit 200a, in synchronism with a clock signal.

The second register 200b2 is adapted to retain the second repair code (fuse data) stored in the storage circuit 200a, in synchronism with the clock signal.

The first decoder 200c1 is adapted to output a first repair decoded signal obtained by decoding the first repair code retained in the first register 200b1.

The second decoder 200c2 is adapted to output a second repair decoded signal obtained by decoding the second repair code retained in the second register 200b2.

The switching circuits respectively in the memory devices 101-1, 101-2, ..., 101-N in the first group are adapted to remove a memory cell corresponding to the first repair decoded signal from objects of data storage and readout, and conduct switching to a redundant cell, in accordance with the first repair decoded signal.

In other words, the same first repair decoded signal is input to all of the N memory devices 101-1, 101-2, ..., 101-N and their switching circuits in these memory devices are brought into the same state.

The switching circuits respectively in the memory devices 101-N+1, 101-N+2, ... 101-N+M in the second group are adapted to remove a memory cell corresponding to the second repair decoded signal from objects of data storage and readout, and conduct switching to a redundant cell, in accordance with the second repair decoded signal.

In other words, the same second repair decoded signal is input to all of the M memory devices 101-N+1, 101-N+2, ..., 101-N+M and their switching circuits in these memory devices are brought into the same state.

As already described, memory devices free of defects are acceptable articles even if they are brought into the repair state. In a plurality of memory devices having defects, there is a case that there are two defects which bring about acceptable articles in repair states which are the same each other. In this case, a plurality of memory devices having the defects are brought into the acceptable article state in repair states corresponding to two repair codes. In other words, the whole semiconductor integrated circuit is repaired by the first and second repair codes.

Typically in the actual manufacturing process, however, the number of memory devices which need repair is smaller than the total number of memory devices as already described.

In the second embodiment, therefore, an upper limit of the number of memory devices to be repaired is set according to the manufacture yield. And the number of required repair codes (two in the present embodiment) is set according to the upper limit of the number of memory devices to be repaired. And the memory devices in the semiconductor integrated circuit share the repair circuit (registers and decoders).

As a result, the circuit area required for the repair circuit can be reduced as compared with the comparative example. Furthermore, since the number of repair codes can be set to be less as compared with the comparative example, the required area of the fuse device can be reduced.

The number of repair codes which are set may be further increased according to the manufacture yield, and the number of group classifications may be increased in association with respective repair codes.

In the semiconductor integrated circuit according to the present embodiment, the increase of the circuit area can be suppressed as heretofore described.

Third Embodiment

There is a case that in the semiconductor integrated circuit 2000 in the second embodiment shown in FIG. 5 a memory cell judged to be defective exists in each of, for example, the memory device 101-N+1 and the memory device 101-N+2, and those memory cells cannot be repaired by the same second repair code. In this case, the memory devices 101-N+1 and 101-N+2 cannot be repaired at a time and the whole semiconductor circuit is judged to be defective. As a result, the semiconductor integrated circuit 2000 itself is regarded as a defective article.

In a third embodiment, therefore, a configuration of a semiconductor integrated circuit capable of improving the repair possibility by controlling the group classification of memory devices in the case where there are defects in memory cells in two memory devices will be described.

Figure 6:
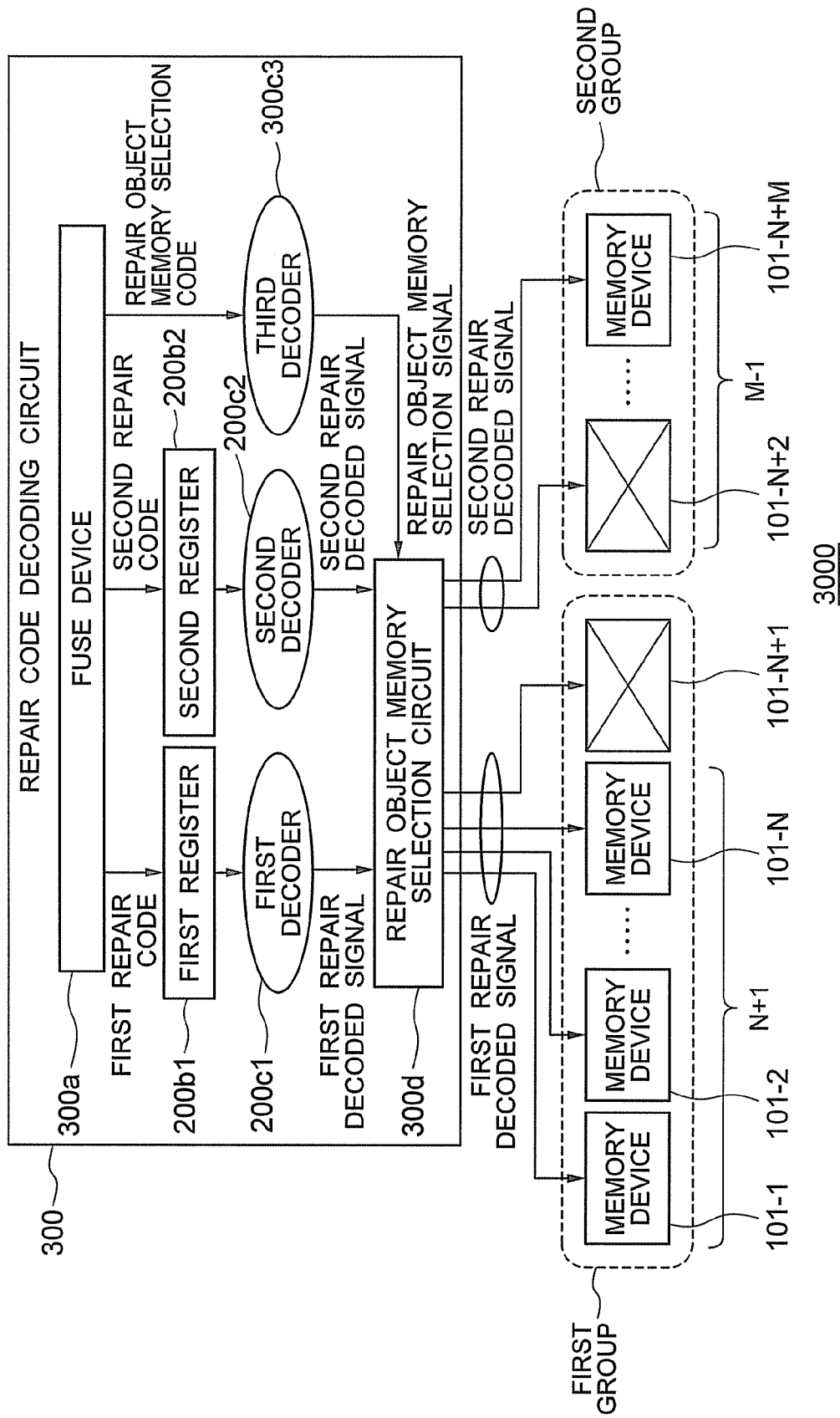
FIG. 6 is a block diagram showing an example of a configuration of a semiconductor integrated circuit 3000 including a plurality of memory devices according to the third embodiment.

FIG. 6 is a block diagram showing an example of a configuration of a semiconductor integrated circuit 3000 including a plurality of memory devices according to the third embodiment. In FIG. 6, the same characters as those in FIG. 5 denote like components in the second embodiment.

As shown in FIG. 6, the semiconductor integrated circuit 3000 includes a plurality of (N+M) memory devices 101-1, 101-2, . . . , 101-N, 101-N+1 101-N+2, . . . 101-N+M, and a repair code decoding circuit 300.

The repair code decoding circuit 300 includes a storage circuit (fuse device) 300$a$, a first register (first fuse register) 200$b$1, a second register (second fuse register) 200$b$2, a first decoder 200$c$1, a second decoder 200$c$2, a third decoder 300$c$3, and a repair object memory selection circuit 300$d$.

In this way, the repair code decoding circuit 300 further includes the third decoder 300$c$3 and the repair object memory selection circuit 300$d$ as compared with the repair code decoding circuit 200 in the second embodiment.

The storage circuit 300$a$ is adapted to store a first repair code (fuse data) to avoid a memory cell judged to be defective on the basis of results obtained by testing the memory devices 101-1, 101-2, . . . , 101-N, 101N+1 classified into a first group in a plurality of memory devices and use a redundant cell, a second repair code (fuse data) to avoid a memory cell judged to be defective on the basis of results obtained by testing the memory devices 101-N+2, . . . , 101-N+M classified into a second group other than the first group in a plurality of memory devices, and use a redundant cell, and a repair object memory selection code (fuse data).

The first repair code and the second repair code are set to be different from each other. The storage circuit 300$a$ has, for example, a fuse element to store the fuse data.

The first and second repair codes are generated by, for example, an external test circuit (not illustrated) and stored in the storage circuit. For example, the test circuit compares a result obtained by testing a memory device according to a test pattern with an expected value, and makes a decision whether the memory device can be repaired, on the basis of a result of the comparison. If the test circuit judges that the memory device can be repaired, the test circuit generates the first or second repair code for conducting redundancy repair on the memory device.

The first register 200$b$1 is adapted to retain the first repair code (fuse data) stored in the storage circuit 300$a$, in synchronism with a clock signal.

The second register 200$b$2 is adapted to retain the second repair code (fuse data) stored in the storage circuit 300$a$, in synchronism with the clock signal.

The first decoder 200$c$1 is adapted to output a first repair decoded signal obtained by decoding the first repair code retained in the first register 200$b$1.

The second decoder 200$c$2 is adapted to output a second repair decoded signal obtained by decoding the second repair code retained in the second register 200$b$2.

The third decoder 300$c$3 is adapted to output a repair object memory selection signal obtained by decoding the repair object memory selection code stored in the storage circuit 300$a$.

The repair object memory selection circuit 300$d$ is adapted to be supplied with the first repair decoded signal, the second repair decoded signal, and the repair object memory selection signal.

The repair object memory selection circuit 300$d$ is adapted to, for example, output the first repair code to the memory devices 101-1, 101-2, . . . , 101-N, 101N+1 101-1, 101-2, . . . , 101-N, 101N+1, 101-N+2, . . . 101-N+M classified into the first group in a plurality of memory devices and output the second repair code to the memory devices 101-N+2, 101-N+M 101-1, 101-2, . . . , 101-N, 101N+1, 101-N+2, . . . , 101-N+M classified into the second group other than the first group in a plurality of memory devices, on the basis of the supplied repair object memory selection signal.

The switching circuits respectively in the memory devices 101-1, 101-2, . . . , 101-N, 101-N+1 in the first group are adapted to remove a memory cell corresponding to the first repair decoded signal from objects of data storage and readout, and conduct switching to a redundant cell, in accordance with the first repair decoded signal.

In other words, the same first repair decoded signal is input to all of the N+1 memory devices 101-1, 101-2, . . . , 101-N, 101-N+1 and their switching circuits in these memory devices are brought into the same state.

The switching circuits respectively in the memory devices 101-N+2, . . . , 101-N+M in the second group are adapted to remove a memory cell corresponding to the second repair decoded signal from objects of data storage and readout, and conduct switching to a redundant cell, in accordance with the second repair decoded signal.

In other words, the same second repair decoded signal is input to all of the M-1 memory devices 101-N+2, . . . , 101-N+M, and their switching circuits in these memory devices are brought into the same state.

If the memory devices of the first group including the memory device 101-N+1 are brought into the acceptable article state in a repair state corresponding to the first repair code and the memory devices of the second group including the memory device 101-N+2 are brought into the acceptable article state in a repair state corresponding to the second repair code, the whole semiconductor integrated circuit is repaired by the first and second repair codes.

In this way, in the third embodiment, the possibility of repair is improved by controlling the classification of groups of memory devices in the case where there are defects in memory cells in two memory devices.

Also, in the third embodiment, the memory devices in the semiconductor integrated circuit share the repair circuit (registers and decoders) in the same way as the second embodiment.

As a result, the circuit area required for the repair circuit can be reduced as compared with the comparative example. Furthermore, since the number of repair codes can be set to be less as compared with the comparative example, the required area of the fuse device can be reduced.

The number of repair codes which are set may be further increased according to the manufacture yield, and the number of group classifications may be increased in association with respective repair codes.

Figure 7:
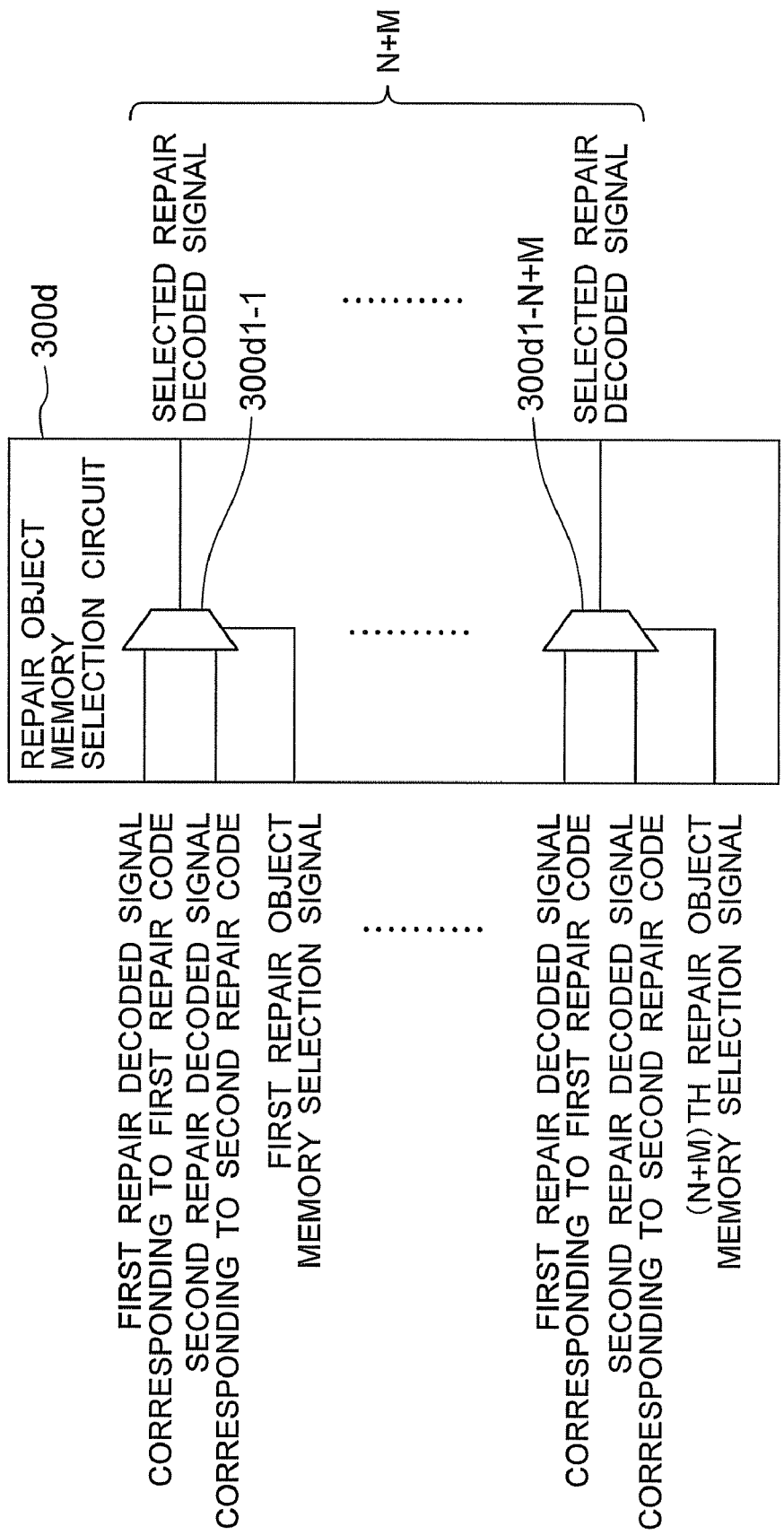
FIG. 7 is a diagram showing an example of a configuration of the repair object memory selection circuit 300d shown in FIG. 6.

FIG. 7 is a diagram showing an example of a configuration of the repair object memory selection circuit 300d shown in FIG. 6.

As shown in FIG. 7, the repair object memory selection circuit 300d includes a plurality of (N+M) multiplexers 300d1-1, . . . , 300d1-N+M.

Each of the multiplexers 300d1-1, . . . , 300d1-N+M is adapted to select either the first or second repair decoded signal in accordance with the repair object memory selection signal (corresponding one of the first to the (N+M)th repair object memory selection signals) and output the selected repair decoded signal to corresponding one of N+M multiplexers.

For example, as shown in FIG. 6, therefore, the first repair decoded signal is input to memory devices classified into the first group and the second repair decoded signal is input to memory devices classified into the second group in accordance with the repair object memory selection signal.

An example of setting of the repair object memory selection code already described will now be described.

Figure 8:
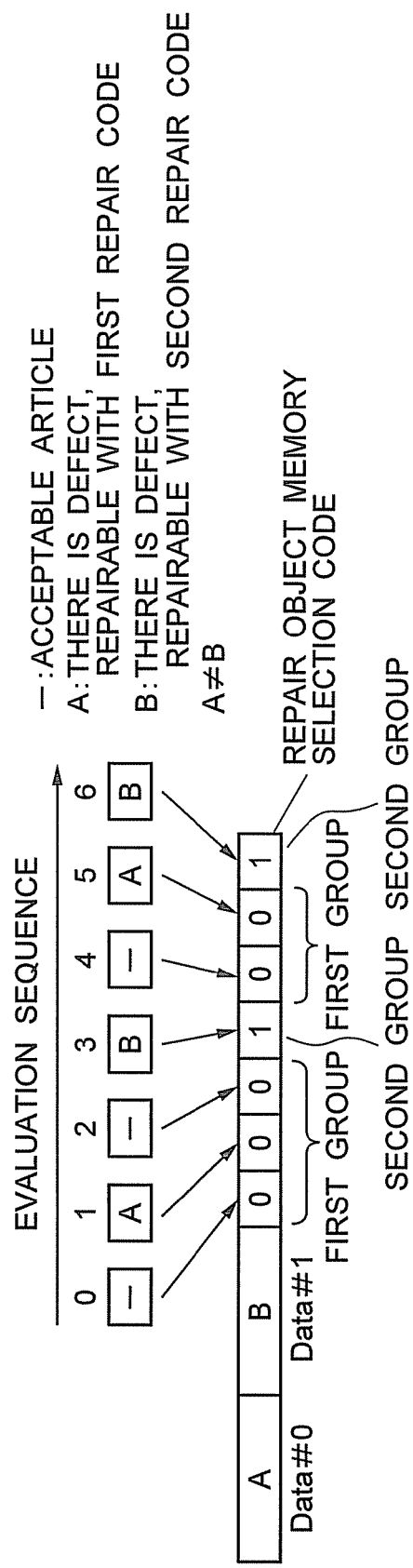
FIG. 8 is a diagram showing an example of assignment of the repair object memory selection code.
Figure 9:
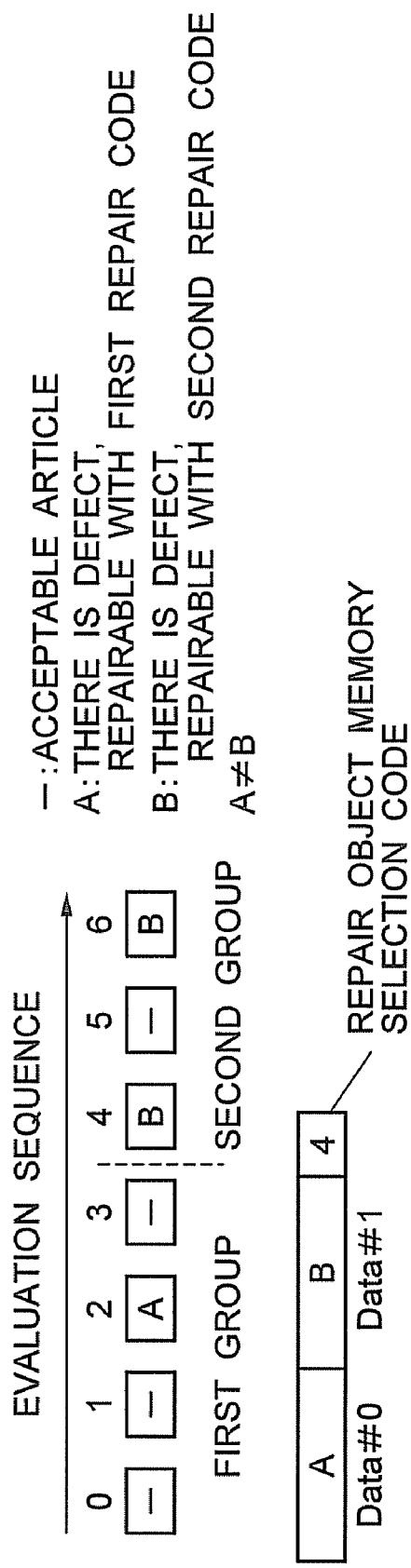
FIG. 9 is a diagram showing another example of assignment of the repair object memory selection code.

FIG. 8 is a diagram showing an example of assignment of the repair object memory selection code. FIG. 9 is a diagram showing another example of assignment of the repair object memory selection code.

As shown in FIG. 8, seven memory devices are formed in line according to, for example, an evaluation (test) order, and numbers 0 to 6 are assigned to memory devices in the order of line forming. It is supposed in the example shown in FIG. 8 that a first defect A exists in memory devices respectively assigned numbers "1" and "5", a second defect B exists in memory devices respectively assigned numbers "3" and "6", and a defect does not exist in memory devices respectively assigned numbers "0", "2" and "4".

In this case, the repair object memory selection code is set to 7-bit data "0001001". Data "0" in the repair object memory selection code specifies selection of the first repair code capable of repairing the first defect A. On the other hand, data "1" in the repair object memory selection code specifies selection of the second repair code capable of repairing the second defect B.

According to the repair object memory selection code, the repair object memory selection circuit 300d applies the first repair code to the memory devices respectively assigned the numbers "1" and "5" (first group), and applies the second repair code to the memory devices respectively assigned the numbers "3" and "6" (second group).

The first repair code is applied to the memory devices respectively assigned the numbers "0", "2" and "4" (the first group), however, these memory devices are judged to be acceptable articles, since there are no defects in the above memory devices as already described.

If it is made possible to arbitrarily set two repair codes for respective memory devices as already described with reference to FIG. 7, then all defects which can be repaired in principle can be actually repaired.

In this case, however, data having the number of bits which is equal to the total number of all memory devices which become the repair objects is needed.

As shown in FIG. 9, memory devices are formed in line. If two memory devices are defective, a boundary is set between them.

Seven memory devices are formed in line according to, for example, an evaluation (test) order, and numbers 0 to 6 are assigned to memory devices in the order of line forming. It is supposed in the example shown in FIG. 9 that a first defect A exists in a memory device assigned a number "2", a second defect B exists in memory devices respectively assigned numbers "4" and "6", and a defect does not exist in memory devices respectively assigned numbers "0", "1", "3" and "4".

In this case, the repair object memory selection code is set to data (boundary index value) "4". Data "0" in the repair object memory selection code specifies selection of the first repair code capable of repairing the first defect A. On the other hand, data "1" in the repair object memory selection code specifies selection of the second repair code capable of repairing the second defect B.

For example, according to the repair object memory selection signal, the repair object memory selection circuit 300d classifies memory devices assigned numbers "0" to "3" including a first number "2" before a boundary is prescribed by the repair object memory selection code into a first group and classifies memory devices assigned numbers "4" to "6" including a second number "4" after the boundary is prescribed by the repair object memory selection code into a second group. The repair object memory selection circuit 300d applies the first repair code to memory devices in the first group and applies the second repair code to memory devices in the second group.

Therefore, each of memory devices to which a repair code is applied can operate as an acceptable article. As a result, it becomes possible to ship the semiconductor integrated circuit itself as an acceptable article.

As a result, the possibility of repairing two memory devices which differ in defect is improved compared to the comparative example. The number of data (a boundary index value) required to specify the boundary is a logarithm of the number of all memory devices of repair object, and it can be implemented with a number of bits which is less than the total number of memory devices.

In the third embodiment, a small number of repair codes and the repair object memory selection code for specifying a memory device to which a repair code is applied are used as heretofore described.

In the semiconductor integrated circuit according to the third embodiment, therefore, the repair capability can be improved as compared with a scheme in which repair codes are applied to fixed memory devices as in the second embodiment.

In the semiconductor integrated circuit according to the present embodiment, an increase of the circuit area can be suppressed while improving the repair capability as heretofore described.

Fourth Embodiment

In the first embodiment, the case where the repair codes stored in the storage circuit are generated by the test circuit external to the semiconductor integrated circuit has been described.

On the other hand, in a fourth embodiment, the case where the semiconductor integrated circuit includes a circuit which generates repair codes will be described.

Figure 10:
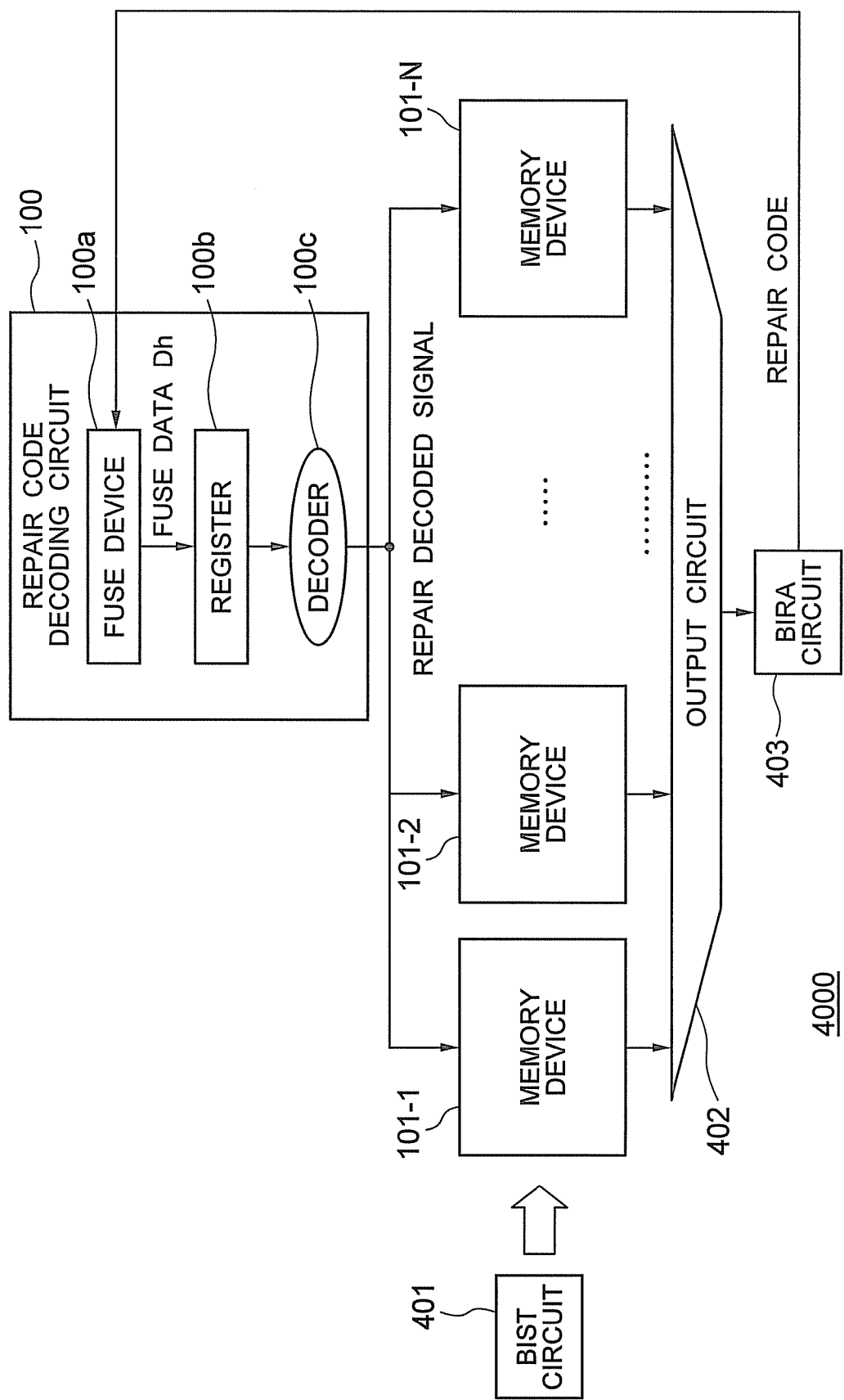
FIG. 10 is a block diagram showing an example of a configuration of a semiconductor integrated circuit 4000 according to the fourth embodiment including a plurality of memory devices.

FIG. 10 is a block diagram showing an example of a configuration of a semiconductor integrated circuit 4000 according to the fourth embodiment including a plurality of memory devices. In FIG. 10, the same characters as those in FIGS. 3 and 4 denote like components in the first embodiment.

As shown in FIG. 10, the semiconductor integrated circuit 4000 includes a plurality of (N) memory devices 101-1, 101-2, . . . , 101-N, a repair code decoding circuit 100, a BIST (Built-in Self-Test) circuit 401, an output circuit 402, and a BIRA (Built-in Redundancy Allocation) circuit 403.

In this way, the semiconductor integrated circuit 4000 further includes the BIST circuit 401, the output circuit 402, and the BIRA circuit 403 as compared with the semiconductor integrated circuit 1000 in the first embodiment.

The BIST circuit 401 is adapted to output a test pattern, output an expected value of a test, and test a plurality of memory devices 101-1, 101-2, . . . , 101-N by using the test pattern. The BIST circuit 401 may be provided externally to the semiconductor integrated circuit 4000.

The output circuit 402 is adapted to be supplied with results obtained by testing the plurality of memory devices 101-1, 101-2, . . . , 101-N, and output the result to the BIRA circuit 403, sequentially.

The BIRA circuit 403 is adapted to make a decision whether all of the plurality of memory devices 101-1, 101-2, . . . , 101-N can be repaired by using one repair code, on the basis of results obtained by testing the plurality of memory devices 101-1, 101-2, . . . , 101-N and the expected values.

If the BIRA circuit 403 judges that all of the plurality of memory devices 101-1, 101-2, . . . , 101-N can be repaired by using one repair code, then the BIRA circuit 403 generates a repair code.

On the other hand, if the BIRA circuit 403 judges that all of the plurality of memory devices cannot be repaired by using one repair code, then the BIRA circuit 403 outputs information to indicate that repair is impossible. Upon receiving this information, the external circuit (not illustrated) judges that the semiconductor integrated circuit 4000 cannot be repaired.

In this way, the BIRA circuit 403 is adapted to generate a repair code to avoid a memory cell judged to be defective in one memory device in the plurality of memory devices 101-1, 101-2, . . . , 101-N and to use a redundant cell, on the basis of results obtained by testing the plurality of memory devices 101-1, 101-2, . . . , 101-N and the expected values. By the way, the repair code is applied to memory devices having no defects as well. Even if memory devices having no defects are brought into the repair state, however, they are judged to be acceptable articles, resulting in no problems.

The repair code generated by the BIRA circuit 403 is stored in the storage circuit 100a.

As heretofore described, the semiconductor integrated circuit 4000 can generate a repair code internally and store the repair code in the storage circuit 100a.

Other functions of the semiconductor integrated circuit 4000 are the same as those of the semiconductor integrated circuit 1000 in the first embodiment. In other words, in the present fourth embodiment, memory devices in the semiconductor integrated circuit share the repair circuit (the register 100b and the decoder 100c) in the same way as the first embodiment. As a result, the circuit area required for the repair circuit can be reduced as compared with the comparative example. Furthermore, since the number of repair codes becomes one, the required fuse device area can be minimized.

According to the semiconductor integrated circuit in the present embodiment, the increase of the circuit area can be suppressed as heretofore described.

Fifth Embodiment

In the third embodiment, the case where the first and second repair codes stored in the storage circuit are generated by the test circuit provided externally to the semiconductor integrated circuit as already described has been described.

On the other hand, in a fifth embodiment, the case where the semiconductor integrated circuit includes a circuit which generates the first and second repair codes will be described.

Figure 11:
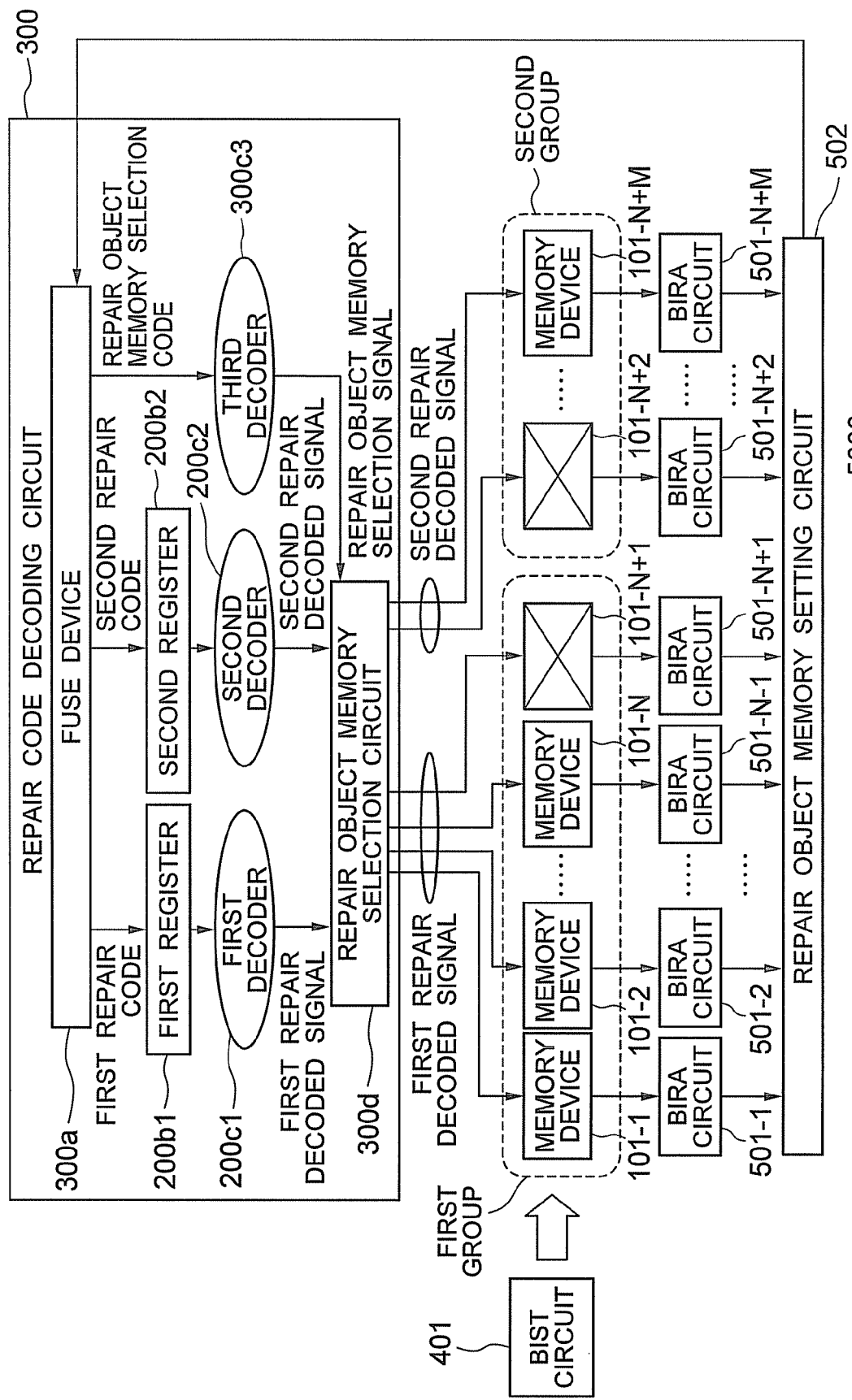
FIG. 11 is a block diagram showing an example of a configuration of a semiconductor integrated circuit 5000 according to the fifth embodiment which includes a plurality of memory devices shown in FIG. 3.

FIG. 11 is a block diagram showing an example of a configuration of a semiconductor integrated circuit 5000 according to the fifth embodiment which includes a plurality of memory devices shown in FIG. 3. In FIG. 11, the same characters as those in FIG. 6 denote like components in the third embodiment.

As shown in FIG. 11, the semiconductor integrated circuit 5000 includes a plurality of (N +M) memory devices 101-1, 101-2, . . . , 101-N, 101-N+1 101-N+2, . . . , 101-N+M, a repair code decoding circuit 300, a BIST circuit 401, a plurality of (N+M) BIRA circuits 501-1, 501-2, . . . , 501-N, 501-N+1, 501-N+2, . . . , 501-N+M, and a repair object memory setting circuit 502.

In this way, the semiconductor integrated circuit 5000 further includes the BIST circuit 401, the BIRA circuits 501-1, 501-2, . . . , 501-N, 501-N+1, 501-N+2, . . . , 501-N+M, and the repair object memory setting circuit 502 as compared with the semiconductor integrated circuit 3000 in the third embodiment.

The BIST circuit 401 is adapted to output a test pattern, output an expected value of a test, and test a plurality of memory devices 101-1, 101-2, . . . , 101-N, 101-N+1 101-N+2, . . . , 101-N+M by using the test pattern. The BIST circuit 401 may be provided externally to the semiconductor integrated circuit 5000.

The plurality of (N+M) BIRA circuits 501-1, 501-2, . . . , 501-N, 501-N+1, 501-N+2, . . . , 501-N+M are provided respectively in association with the plurality of (N+M) memory devices 101-1, 101-2, . . . , 101-N, 101-N+1, 101-N+2, . . . , 101-N+M in one-to-one correspondence. The plurality of (N+M) BIRA circuits 501-1, 501-2, . . . , 501-N, 501-N+1, 501-N+2, . . . , 501-N+M are adapted to respectively generate repair codes to avoid a memory cell judged to be defective and to use a redundant cell, on the basis of results obtained by testing corresponding memory cells and expected values.

The repair object memory selection circuit 300d is adapted to be supplied with the first repair decoded signal, the second repair decoded signal, and the repair object memory selection signal in the same way as the third embodiment.

For example, if the repair object memory selection code is set in the same way as FIG. 9, then the repair object memory selection circuit 300d classifies the memory devices 101-1, 101-2, . . . , 101-N, 101-N+1 assigned numbers including a first number before a boundary is prescribed by the repair object memory selection code into a first group and classifies the memory devices 101-N+2, . . . , 101-N+M assigned numbers including a second number after the boundary is prescribed by the repair object memory selection code into a second group, in accordance with the repair object memory selection signal.

In other words, the repair object memory selection circuit 300d is adapted to output the first repair code to the memory devices 101-1, 101-2, . . . , 101-N, 101N+1 classified into the first group in the plurality of memory devices 101-1, 101-2, . . . , 101-N, 101N+1, 101-N+2, . . . , 101-N+M and output the second repair code to the memory devices 101-N+2, . . . , 101-N+M classified into the second group other than the first group in the plurality of memory devices 101-1, 101-2, . . . , 101-N, 101N+1, 101-N+2, . . . , 101-N+M, on the basis of the supplied repair object memory selection signal.

Repair codes generated respectively by the plurality of BIRA circuits 501-1, 501-2, . . . , 501-N, 501-N+1, 501-N+2, . . . , 501-N+M are input to the repair object memory setting circuit 502. The repair object memory setting circuit 502 is adapted to generate the repair object memory selection code to classify the plurality of memory devices 101-1, 101-2, . . . , 101-N, 101N+1, 101-N+2, . . . , 101-N+M into the first group to which the first repair code in the repair codes is applied and the second group to which the second repair code in the repair codes is applied.

For example, in the same way as FIG. 8 already described, the repair object memory setting circuit 502 assigns numbers to the plurality of memory devices 101-1, 101-2, . . . , 101-N, 101N+1, 101-N+2, . . . , 101-N+M in the order in which the devices are formed in line. In addition, the repair object memory setting circuit 502 generates, for example, a repair object memory selection code which classifies the memory devices 101-1, 101-2, . . . , 101-N, 101N+1 assigned numbers including the first number into the first group to which the first repair code is applied, and classifies the memory devices 101-N+2, . . . , 101-N+M assigned numbers including the second number into the second group to which the second repair code is applied.

As another example, in the same way as FIG. 9 already described, the repair object memory setting circuit 502 assigns numbers to the plurality of memory devices 101-1, 101-2, . . . , 101-N, 101N+1, 101-N+2, . . . , 101-N+M in the order in which the devices are formed in line. In addition, the repair object memory setting circuit 502 generates, for example, a repair object memory selection code which prescribes a boundary between a first number which is assigned to the memory device 101-N+1 to be repaired by using the first repair code and a second number which is assigned to the memory device 101-N+2 to be repaired by using the second repair code.

The repair object memory selection code generated by the repair object memory setting circuit 502 in this way is stored in the storage circuit 300a.

In particular, the repair object memory setting circuit 502 is adapted to make a decision whether all memory devices classified into the first group can be repaired by using the same first repair code and whether all memory devices classified into the second group can be repaired by using the same second repair code.

If it is judged that all memory devices classified into the first group and all memory devices classified into the second group can be repaired, then the repair object memory setting circuit 502 stores the first repair code, the second repair code, and the repair object memory selection code in the storage circuit 300a.

On the other hand, the repair object memory setting circuit 502 makes a decision whether all defective memories can be repaired by using as many repair codes as can be stored. If the repair object memory setting circuit 502 judges that all defective memories cannot be repaired, then it outputs information which indicates that all defective memories cannot be repaired.

In addition, if the number of repair codes respectively generated by the plurality of (N+M) BIRA circuits 501-1, 501-2, . . . , 501-N, 501-N+1, 501-N+2, . . . , 501-N+M exceeds a prescribed number (two here), the repair object memory setting circuit 502 outputs information which indicates that a plurality of devices cannot be repaired.

In addition, if the repair object memory setting circuit 502 judges that some of the plurality of BIRA circuits 501-1, 501-2, . . . , 501-N, 501-N+1, 501-N+2, . . . , 501-N+M cannot repair its corresponding memory device, then the repair object memory setting circuit 502 outputs information which indicates that the repair is impossible.

For example, upon receiving the information which indicates that repair is impossible, an external circuit (not illustrated) judges that the semiconductor integrated circuit 5000 cannot be repaired.

As heretofore described, the semiconductor integrated circuit 5000 can generate the first and second repair codes internally and store them in the storage circuit 300a.

Other functions of the semiconductor integrated circuit 500 are the same as those of the semiconductor integrated circuit 3000 in the third embodiment. In other words, in the present fifth embodiment, memory devices in the semiconductor integrated circuit share the repair circuit (the first and second registers 200b1 and 200b2 and the first and second decoders 200c1 and 200c2) in the same way as the third embodiment. As a result, the circuit area required for the repair circuit can be reduced as compared with the comparative example.

According to the semiconductor integrated circuit in the present embodiment, the increase of the circuit area can be suppressed as heretofore described.

What is claimed is:

1. A semiconductor integrated circuit repairing a plurality of memory devices by using one repair code, the semiconductor integrated circuit comprising:
    a plurality of memory devices each comprising a memory cell array which includes a plurality of memory cells to store data, a spare part which includes a redundant cell to avoid a memory cell judged to be defective in the plurality of memory cells and conduct redundancy repair on data, and a switching circuit to avoid the defective memory cell and conduct switching to the redundant cell; and
    a repair code decoding circuit comprising a storage circuit which stores a repair code, a decoder which outputs a repair decoded signal obtained by decoding the repair code,
    wherein the switching circuit respectively in the memory devices avoids a memory cell corresponding to the repair decoded signal and conducts switching to the redundant cell of the memory devices in accordance with the repair decoded signal.

2. The semiconductor integrated circuit according to claim 1, wherein the repair code decoding circuit further comprises a register that retains the repair code stored in the storage circuit, the decoder outputting the repair decoded signal obtained by decoding the repair code retained in the register.

3. The semiconductor integrated circuit according to claim 1, further comprising a BIRA circuit that generates the repair code to avoid a memory cell judged to be defective in one memory device in the plurality of memory devices and to use the redundant cell, on the basis of results obtained by testing the plurality of memory devices sequentially and a expected values, the repair code generated by the BIRA circuit being stored in the storage circuit, wherein the BIRA circuit decides whether all of the plurality of memory devices can be repaired by using one repair code, on the basis of results obtained by testing the plurality of memory devices and the expected values, if the BIRA circuit judges that all of the plurality of memory devices can be repaired by using one repair code, then the BIRA circuit generates a repair code, and if the BIRA circuit judges that all of the plurality of memory devices cannot be repaired by using one repair code, then the BIRA circuit outputs information to indicate that repair is impossible.

4. The semiconductor integrated circuit according to claim 2, further comprising a BIRA circuit that generates the repair code to avoid a memory cell judged to be defective in one memory device in the plurality of memory devices and to use the redundant cell, on the basis of results obtained by testing the plurality of memory devices and a expected values, the repair code generated by the BIRA circuit being stored in the storage circuit, wherein the BIRA circuit decides whether all of the plurality of memory devices can be repaired by using one repair code, on the basis of results obtained by testing the plurality of memory devices sequentially and the expected values, if the BIRA circuit judges that all of the plurality of memory devices can be repaired by using one repair code, then the BIRA circuit generates a repair code, and if the BIRA circuit judges that all of the plurality of memory devices cannot be repaired by using one repair code, then the BIRA circuit outputs information to indicate that repair is impossible.

5. The semiconductor integrated circuit according to claim 3, further comprising an output circuit that is supplied with results obtained by testing the plurality of memory devices and output the result to the BIRA circuit, sequentially.

6. The semiconductor integrated circuit according to claim 1, wherein the storage circuit has a fuse element to store a fuse data.

7. The semiconductor integrated circuit according to claim 1, wherein the memory device is an SRAM or a DRAM.

8. A semiconductor integrated circuit comprising:

a plurality of memory devices each comprising a memory cell array which includes a plurality of memory cells to store data, a spare part which includes a redundant cell to avoid a memory cell judged to be defective in the plurality of memory cells and conduct redundancy repair on data, and a switching circuit to avoid the defective memory cell and conduct switching to the redundant cell; and a repair code decoding circuit comprising a storage circuit which stores a first repair code and a second repair code different from the first repair code, a first decoder which outputs a first repair decoded signal obtained by decoding the first repair code, a second decoder which outputs a second repair decoded signal obtained by decoding the second repair code, wherein the switching circuit respectively in first memory devices avoids a memory cell corresponding to the first repair decoded signal and conducts switching to the redundant cell of the first memory devices in accordance with the first repair decoded signal, the first memory devices classified into a first group in the plurality of memory devices, and the switching circuit respectively in second memory devices avoids a memory cell corresponding to the second repair decoded signal and conducts switching to the redundant cell of the second memory devices in accordance with the second repair decoded signal, the second memory devices classified into a second group other than the first group in the plurality of memory devices.

9. The semiconductor integrated circuit according to claim 8, wherein the repair code decoding circuit further comprises a first register that retains the first repair code stored in the storage circuit and a second register that retains the second repair code stored in the storage circuit, the first decoder outputting the first repair decoded signal obtained by decoding the first repair code retained in the first register, and the second decoder outputting the second repair decoded signal obtained by decoding the second repair code retained in the second register.

10. The semiconductor integrated circuit according to claim 8, wherein the storage circuit has a fuse element to store a fuse data.

11. The semiconductor integrated circuit according to claim 8, wherein the memory device is an SRAM or a DRAM.

12. A semiconductor integrated circuit comprising:

a plurality of memory devices each comprising a memory cell array which includes a plurality of memory cells to store data, a spare part which includes a redundant cell to avoid a memory cell judged to be defective in the plurality of memory cells and conduct redundancy repair on data, and a switching circuit to avoid the defective memory cell and conduct switching to the redundant cell; and a repair code decoding circuit comprising a storage circuit which stores a first repair code, a second repair code different from the first repair code, and a repair object memory selection code, a first decoder which outputs a first repair decoded signal obtained by decoding the first repair code, a second decoder which outputs a second repair decoded signal obtained by decoding the second repair code, a third decoder which decodes the repair object memory selection code and outputs a repair object memory selection signal, and a repair object memory selection circuit which is supplied with the first repair decoded signal, the second repair decoded signal, and the repair object memory selection signal to output the first repair code to first memory devices classified into a first group in the plurality of memory devices based on the repair object memory selection signal and to output the second repair code to second memory devices classified into a second group other than the first group in the plurality of memory devices based on the repair object memory selection signal, wherein the switching circuit respectively in the first memory devices avoids a memory cell corresponding to the first repair decoded signal and conducts switching to the redundant cell of the first memory devices in accordance with the first repair decoded signal, and the switching circuit respectively in the second memory devices avoids a memory cell corresponding to the second repair decoded signal and conducts switching to the redundant cell of the second memory devices in accordance with the second repair decoded signal.

13. The semiconductor integrated circuit according to claim 12, wherein the repair code decoding circuit further comprises a first register that retains the first repair code stored in the storage circuit and a second register that retains the second repair code stored in the storage circuit, the first decoder outputting the first repair decoded signal obtained by decoding the first repair code retained in the first register, and the second decoder outputting the second repair decoded signal obtained by decoding the second repair code retained in the second register.

14. The semiconductor integrated circuit according to claim 12, further comprising:
- a plurality of BIRA circuits which are provided respectively in association with the plurality of memory devices in one-to-one correspondence and each of which generates a repair code to avoid a memory cell judged to be defective and use the redundant cell, on the basis of a result obtained by testing a corresponding memory device and an expected value; and
- a repair object memory setting circuit which is supplied with the repair codes generated respectively by the plurality of BIRA circuits, and which generates the repair object memory selection code to classify the plurality of memory devices into a first group to which the first repair code out of the repair codes is applied and a second group to which the second repair code out of the repair codes is applied,
- wherein the repair object memory selection code generated by the repair object memory setting circuit is stored in the storage circuit.

15. The semiconductor integrated circuit according to claim 13, further comprising:
- a plurality of BIRA circuits which are provided respectively in association with the plurality of memory devices in one-to-one correspondence and each of which generates a repair code to avoid a memory cell judged to be defective and use the redundant cell, on the basis of a result obtained by testing a corresponding memory device and an expected value; and
- a repair object memory setting circuit which is supplied with the repair codes generated respectively by the plurality of BIRA circuits, and which generates the repair object memory selection code to classify the plurality of memory devices into a first group to which the first repair code out of the repair codes is applied and a second group to which the second repair code out of the repair codes is applied,
- wherein the repair object memory selection code generated by the repair object memory setting circuit is stored in the storage circuit.

16. The semiconductor integrated circuit according to claim 14, wherein
- the repair object memory setting circuit assigns numbers to the plurality of memory devices in order in which the plurality of memory devices are formed in line, and in addition generates a repair object memory selection code which prescribes a boundary between a first number assigned to a memory device to be repaired by using the first repair code and a second number assigned to a memory device to be repaired by using the second repair code, and
- the repair object memory selection circuit classifies memory devices assigned numbers including the first number before the boundary is prescribed by the repair object memory selection code into a first group and classifies memory devices assigned numbers including the second number after the boundary is prescribed by the repair object memory selection code into a second group, in accordance with the repair object memory selection signal which is output by the third decoder.

17. The semiconductor integrated circuit according to claim 15, wherein
- the repair object memory setting circuit assigns numbers to the plurality of memory devices in order in which the plurality of memory devices are formed in line, and in addition generates a repair object memory selection code which prescribes a boundary between a first number assigned to a memory device to be repaired by using the first repair code and a second number assigned to a memory device to be repaired by using the second repair code, and
- the repair object memory selection circuit classifies memory devices assigned numbers including the first number before the boundary is prescribed by the repair object memory selection code into a first group and classifies memory devices assigned numbers including the second number after the boundary is prescribed by the repair object memory selection code into a second group, in accordance with the repair object memory selection signal which is output by the third decoder.

18. The semiconductor integrated circuit according to claim 14, wherein if some of the plurality of BIRA circuits cannot repair its corresponding memory device, then the repair object memory setting circuit outputs information which indicates that the repair is impossible.

19. The semiconductor integrated circuit according to claim 15, wherein if some of the plurality of BIRA circuits cannot repair its corresponding memory device, then the repair object memory setting circuit outputs information which indicates that the repair is impossible.

20. The semiconductor integrated circuit according to claim 12, wherein the memory device is an SRAM or a DRAM.

* * * * *